(12) United States Patent
Ha et al.

(10) Patent No.: US 7,458,833 B2
(45) Date of Patent: Dec. 2, 2008

(54) INSEPARABLE PCB MODULE IN A SUB BODY OF A DEVICE

(75) Inventors: Dong-In Ha, Seoul (KR); Jae-Ho Kim, Suwon-si (KR); In-Chull Yang, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 11/704,171

(22) Filed: Feb. 8, 2007

(65) Prior Publication Data

US 2007/0202720 A1   Aug. 30, 2007

(30) Foreign Application Priority Data

Feb. 8, 2006   (KR) ...................... 10-2006-0012264

(51) Int. Cl.
*H01R 3/00* (2006.01)
*H04M 1/00* (2006.01)

(52) U.S. Cl. .................................... 439/165; 455/575.1

(58) Field of Classification Search ................. 439/164, 439/162, 446, 534, 165; 455/575.1, 575.3; 379/428.01; 174/254, 268; 361/749
See application file for complete search history.

(56) References Cited

U.S. PATENT DOCUMENTS

| | | | | |
|---|---|---|---|---|
| 4,028,509 A | * | 6/1977 | Zurcher | ...................... 200/5 A |
| 4,885,430 A | * | 12/1989 | Kinser et al. | ................. 361/749 |
| 5,134,252 A | * | 7/1992 | Himeno et al. | ............... 174/268 |
| 5,250,758 A | * | 10/1993 | Fjelstad et al. | ............... 174/254 |
| 5,681,176 A | * | 10/1997 | Ibaraki et al. | ................ 439/165 |
| 6,439,905 B2 | * | 8/2002 | Andrews et al. | ............. 439/165 |
| 7,269,255 B2 | * | 9/2007 | Satoh et al. | ............ 379/428.01 |
| 2005/0037821 A1 | * | 2/2005 | Takagi | ...................... 455/575.3 |

FOREIGN PATENT DOCUMENTS

| | | |
|---|---|---|
| KR | 1019990075853 | 10/1999 |
| KR | 1020020052514 | 7/2002 |
| KR | 1020050031154 | 4/2005 |
| KR | 1020050073335 | 7/2005 |

* cited by examiner

*Primary Examiner*—Chandrika Prasad
(74) *Attorney, Agent, or Firm*—The Farrell Law Firm, PC (57) ABSTRACT

Provided is an inseparable PCB module installed in a sub body of a device including a main body and the sub body performing predetermined opening and closing operations with respect to the main body. In the inseparable PCB module, a body part having a predetermined area, and a main body connecting part extending from the body part to a predetermined length and electrically connected to the main body are integrally formed, thereby reducing the entire volume and thickness of the device.

18 Claims, 6 Drawing Sheets

INSEPARABLE PCB MODULE IN A SUB BODY OF A DEVICE

This application claims priority under 35 U.S.C. § 119 to an application entitled "Inseparable PCB Module" filed in the Korean Intellectual Property Office on Feb. 8, 2006 and assigned Serial No. 2006-12264, the contents of which are incorporated herein by reference.

BACKGROUND OF THE INVENTION

1. Field of the Invention

The present invention relates generally to a printed circuit board (PCB) module for a device including a main body and a sub body configured to perform an opening/closing operation with respect to the main body in a predetermined direction, and in particular, to an inseparable PCB module that can reduce an entire thickness and volume of a device and have a simple assembly structure.

2. Description of the Related Art

With the development of various electronic and communication technologies, devices provide more functions while maintaining their present small size. Furthermore, as additional functions are added to the basic functions of a device, various individual functions are being gradually integrated into one device. Also, devices are undergoing a transition from a bar type to a folder or slide type. Such a transition is made because the folder type or slide type devices can respond better to users' changing demands, even though those different types of devices have the same functions. The transition will now be described in detail, using a mobile terminal as an example.

As mobile terminals have come into wide use, mobile terminals having various designs and additional functions as well as basic voice-communication functions are being released in response to users' demands. The terminals have evolved from a bar type to a flip type, a flip-up type, and a folder type. Of the various types of terminals, the folder type terminals seem to be the most popular in the current mainstream. This is because the folder type terminal has a space large enough to allow adoption of a wide LCD panel as a display unit, and is folded into half, thus providing better portability than the other terminals.

Also, a new type of terminal has been emerged which may be equipped with a display unit having a wide LCD panel as large as the aforementioned folder type terminal, and can contribute to miniaturization of a terminal while still meeting users' various demands. This type of terminal is called a slide type terminal. Such a slide type terminal includes a main body and a sub body (generally called 'a slide body') that slides over a predetermined distance in the lengthwise direction of the terminal to open the terminal, and it can meet users' changing tastes better than the existing folder type terminal. Besides the mentioned types of terminals, pop-up terminals, slide and rotation type terminals, etc. are being continuously released.

Most of the terminals have a main body including a main board, and a sub body (e.g., a folder, a slide body, a pop-up body, etc.) performing a predetermined operation with respect to the main body. Most electronic components including a terminal control chip are mounted on the main board of the main body. Also, the main body receives power directly from a power supply. The sub body includes a LCD panel as a display unit and receives power and receives/transmits data through an electrical connection unit extending from the main body.

However, it is difficult to assemble the internal structure of the sub body configured in the aforementioned manner because an LCD panel is electrically connected to a rigid sub PCB through a separate connector, a separate key assembly is mounted thereon, and a separate electrical connection unit having one end connected to the main body and the other end connected to the sub PCB is typically required. Also, an open circuit may occur due to the frequent operation of the terminal. Specifically, because the sub PCB and the LCD panel are separately assembled, an entire volume and thickness of the terminal increases, which goes against the current tendency toward a slim profile and a light weight of the terminal.

SUMMARY OF THE INVENTION

An object of the present invention is to substantially solve at least the above problems and/or disadvantages and to provide at least the advantages below. Accordingly, an object of the present invention is to provide an inseparable PCB module configured to minimize an entire volume and thickness of a device.

Another object of the present invention is to provide an inseparable PCB module implemented to allow an internal structure of a sub body to be simply assembled.

A further object of the present invention is to an inseparable PCB module capable of preventing problems such as an open circuit due to frequent physical operations of a device by electrically connecting a main board with a sub board without using a separate electrical connection unit.

Still another object of the present invention is to provide an inseparable PCB module configured to contribute to a reduction of an entire thickness and volume of a device by using a flexible printed circuit board (FPCB) as a PCB unit of a sub body.

According to an aspect of the present invention, in an inseparable PCB module installed in a sub body of a device including a main body and the sub body configured to perform opening/closing operations with respect to the main body, a body part having a predetermined area, and a main body connecting part extending from the body part to a predetermined length and electrically connected to the main body are integrally formed.

BRIEF DESCRIPTION OF THE DRAWINGS

The above and other objects, features, and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described herein below with reference to the accompanying drawings. In the following description, well-known functions or constructions are not described in detail because they would obscure the present invention in unnecessary detail.

To describe the present invention, a slide type mobile terminal having a slide body and a folder type mobile terminal having a folder are illustrated and described. However, the present invention is not limited thereto, but may be applied to any device having one body making a physical movement with respect to another body, and where the other body is electrically connected to the one body.

Figure 1:
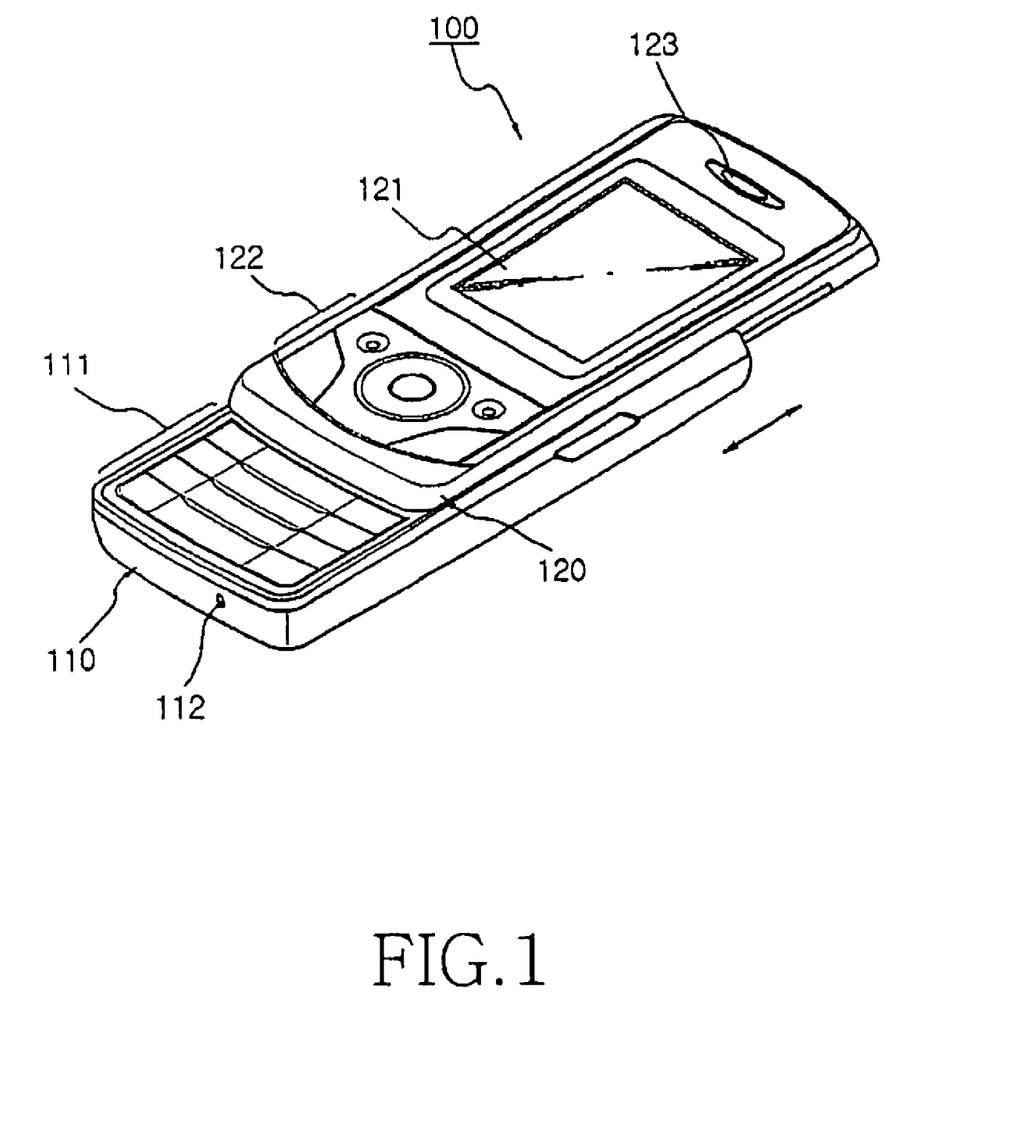
FIG. 1 is a perspective view of a slide type mobile terminal employing an inseparable printed circuit board module (PCB module) according to the present invention.

FIG. 1 is a perspective view of a slide type mobile terminal 100 employing an inseparable PCB module according to the present invention. The slide type mobile terminal 100 includes a main body 110, and a slide body 120 which slides over a predetermined distance with respect to the main body 110 in a lengthwise direction of the terminal 100.

A keypad assembly 111 including a plurality of key buttons is installed on a surface of the main body 110 viewed when the slide body 120 slides up to open the terminal. A microphone unit 112 is installed below the keypad assembly 111 to send a voice of a user to the other party.

Figure 2:
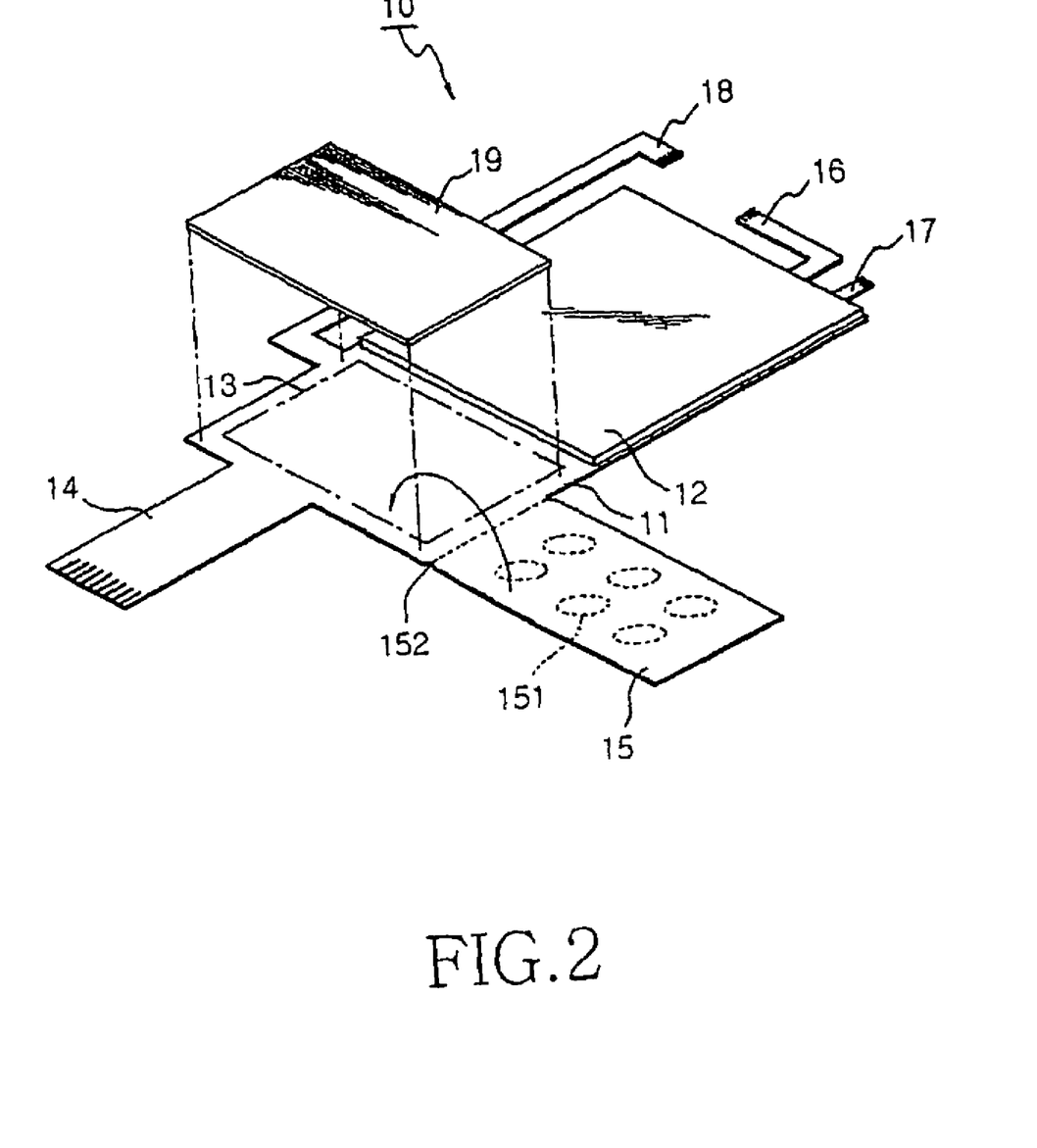
FIG. 2 is an exploded perspective view of an inseparable PCB module according to the present invention.

A display unit 121 of a predetermined size is installed on the slide body 120, and a high-quality color wide LCD panel 12 of FIG. 2 may be used as the display unit 121. Another keypad assembly 122 including a plurality of key buttons is installed below the display unit 121. The keypad assembly 122 may include function keys such as navigation keys so that a user can use the terminal without sliding up the slide body 120 (i.e., opening the terminal). A speaker unit 123 is installed above the display unit 121 to make a received voice of the other party audible. Although not shown, a vibration unit may be installed in the slide body 120, and a camera module for shooting a subject may be additionally installed at a rear side thereof.

The slide body 120 includes an electrical connection unit so as to remain electrically connected to the main body 110 even when the slide body 120 continuously slides up and down with respect to the main body 110 for the opening and closing the terminal. Preferably, in the present invention, the electrical connection unit is formed integrally with a PCB module 10 of FIG. 2 that constitutes the slide body, thereby eliminating the need for a separate unit such as a connection cable. Hereinafter, the inseparable PCB module 10 used in the slide body 120 will be described.

FIG. 2 is an exploded perspective view of the inseparable PCB module 10 according to the present invention. Referring to FIG. 2, every component of the slide body 120 is electrically connected to one PCB module 10. Therefore, a flexible printed circuit board (FPCB) is preferably used as the PCB module 10. However, the present invention is not limited thereto. For example, only diverging parts 16, 17 and 18, a main body connecting part 14, a keypad part 15 may be connected to an ultra-thin rigid PCB by an FPCB.

As shown in FIG. 2, the PCB module 10 includes a body part 11 having almost the same area as that of the slide body 120, and a main body connecting part 14, a keypad part 15, and a plurality of diverging parts 16, 17 and 18 that integrally extend out from the body part. Also, predetermined patterns are formed on the extending parts to be electrically connected with desired components.

An LCD panel 12 of a predetermined size is mounted on the body part 11, which is very much simplified as compared to a conventional configuration where a board including an LCD panel is electrically connected to a board of a slide body by a predetermined connector. An electronic function group for operating the slide body 120 is mounted in a region 13 of the body part 11 remaining after the mounting of the LCD panel 12.

The main body connecting part 14 extending from the body part 11 for a predetermined length in a predetermined direction penetrates a case frame of the slide body 120, is led into the main body 110, and is electrically connected to the main board. The main body connecting part 14 has an extra portion long enough to prevent an open circuit or twist when the slide body 120 slides up and down.

The keypad part 15 is formed and extends at a side of the body part 11 where the electronic elements are mounted. However, the present invention is not limited thereto, and the keypad part 15 may be formed on the body part 11 if the body part 11 has a space for the keypad part 15. The keypad part 15 may be used as the keypad assembly 111 on the slide body 120 of FIG. 1. A plurality of metal domes 151 are attached at regular intervals on a rear surface of the keypad part 15, and is respectively connected to carbon contacts on the keypad part 15, thereby performing a key action. The reason why the metal domes 151 are attached to the rear side of the keypad part 15 is that the keypad part 15 is folded with respect to the body part 11 in a predetermined direction (i.e., in the direction of the arrow in FIG. 2). The folding of the keypad part 15 may be facilitated by forming recesses 152 at both ends of a folded boundary portion between the keypad part and the body part.

The diverging parts 16, 17 and 18 are used as an electrical connection unit for operating the components of the slide body 120. For example, the diverging parts 16, 17, and 18 may be electrically connected to the speaker unit, the vibration unit and the camera module installed in the slide body 120. Also, consequently, the diverging parts 16, 17 and 18 and the keypad part 15 are electrically connected to the main body connecting part 11 by a predetermined pattern. Thus, various elements of the slide body 120 can be operated by key manipulation of the keypad assembly 111 configured on the main body 110.

Figure 3:
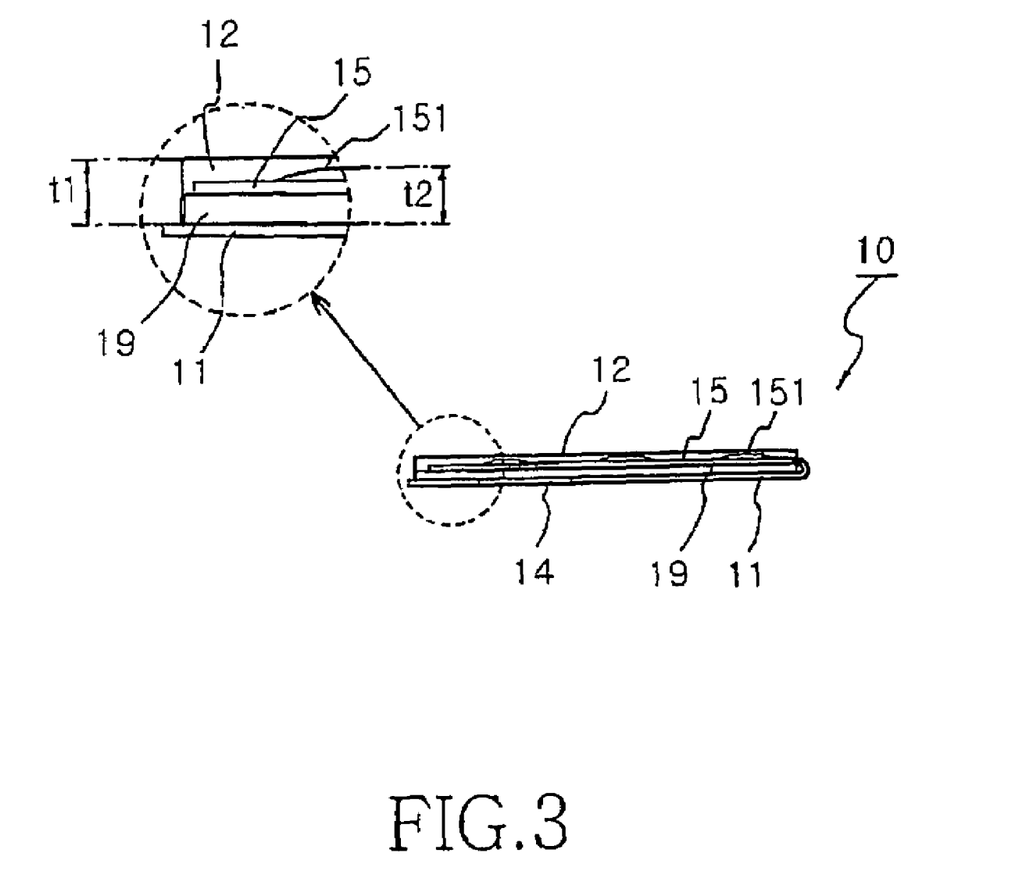
FIG. 3 is a front view illustrating a state for installing an inseparable PCB module to a terminal according to the present invention.

FIG. 3 is a front view illustrating a state for installing an inseparable PCB module 10 to the terminal 100 according to the present invention. Preferably, a plate type shield can 19 having a predetermined area may be used between the keypad part 15 and the body part 11. The shield can 19 may shield electromagnetic waves emitted from electronic elements. Furthermore, the shield can 19 serves as a support plate supporting a bottom of the keypad part 15 configured using an FPC when the metal domes 151 of the keypad part 15 are pressurized. Thus, a separate support unit used when the metal dome 151 is pressurized is not needed, which may contribute to forming a slim profile of the terminal. More preferably, the overall thickness $t2$ of the shield can 19, the keypad part 15 disposed thereabove, and the metal dome 151 is smaller than the entire thickness of the LCD panel 12 mounted in the body part 11, thereby contribute to reducing the entire thickness of the terminal.

Figure 4A:
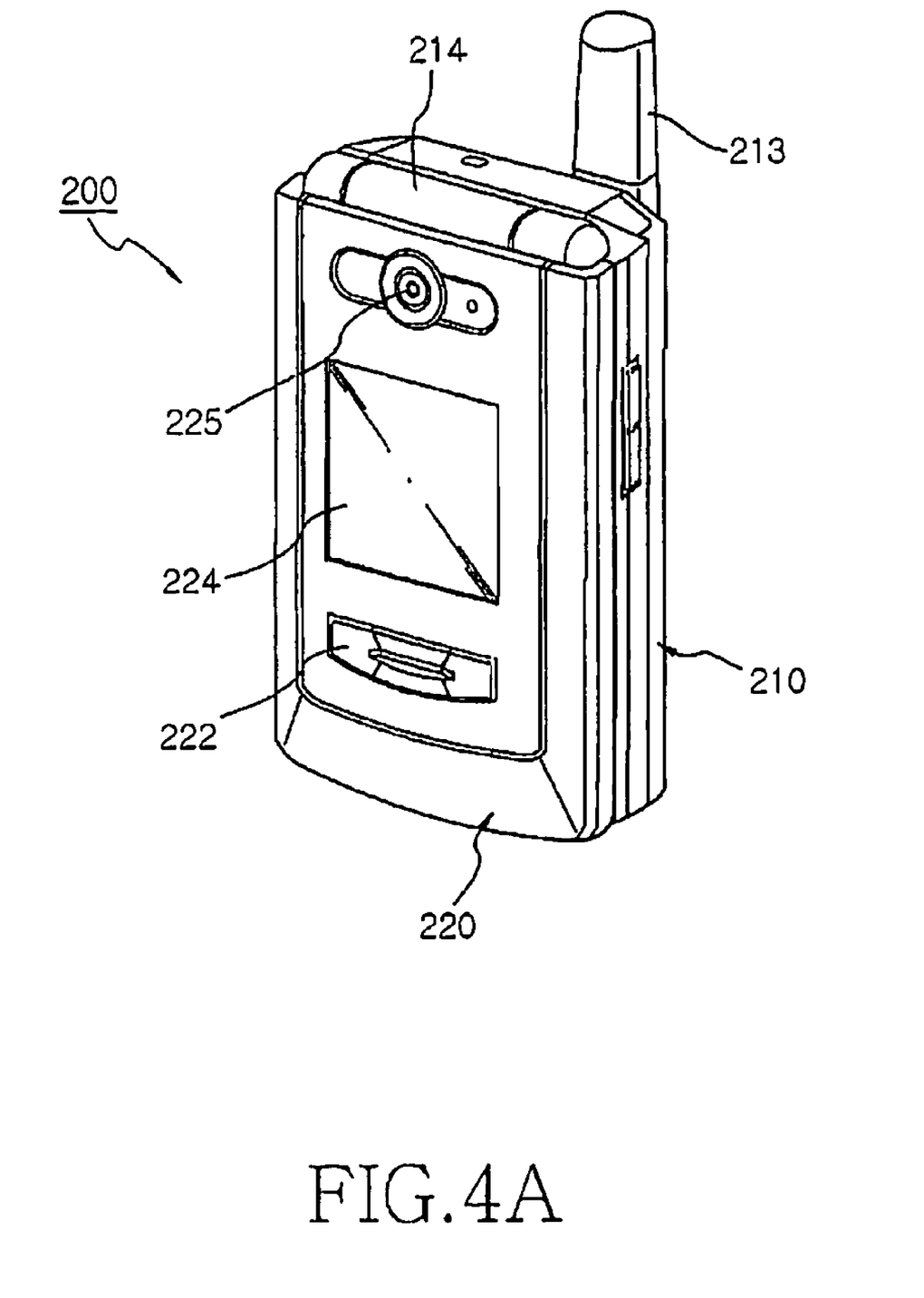
FIGS. 4A and 4B are perspective views, respectively illustrating opened and closed states of a folder type mobile terminal employing an inseparable PCB module according to the present invention.
Figure 4B:
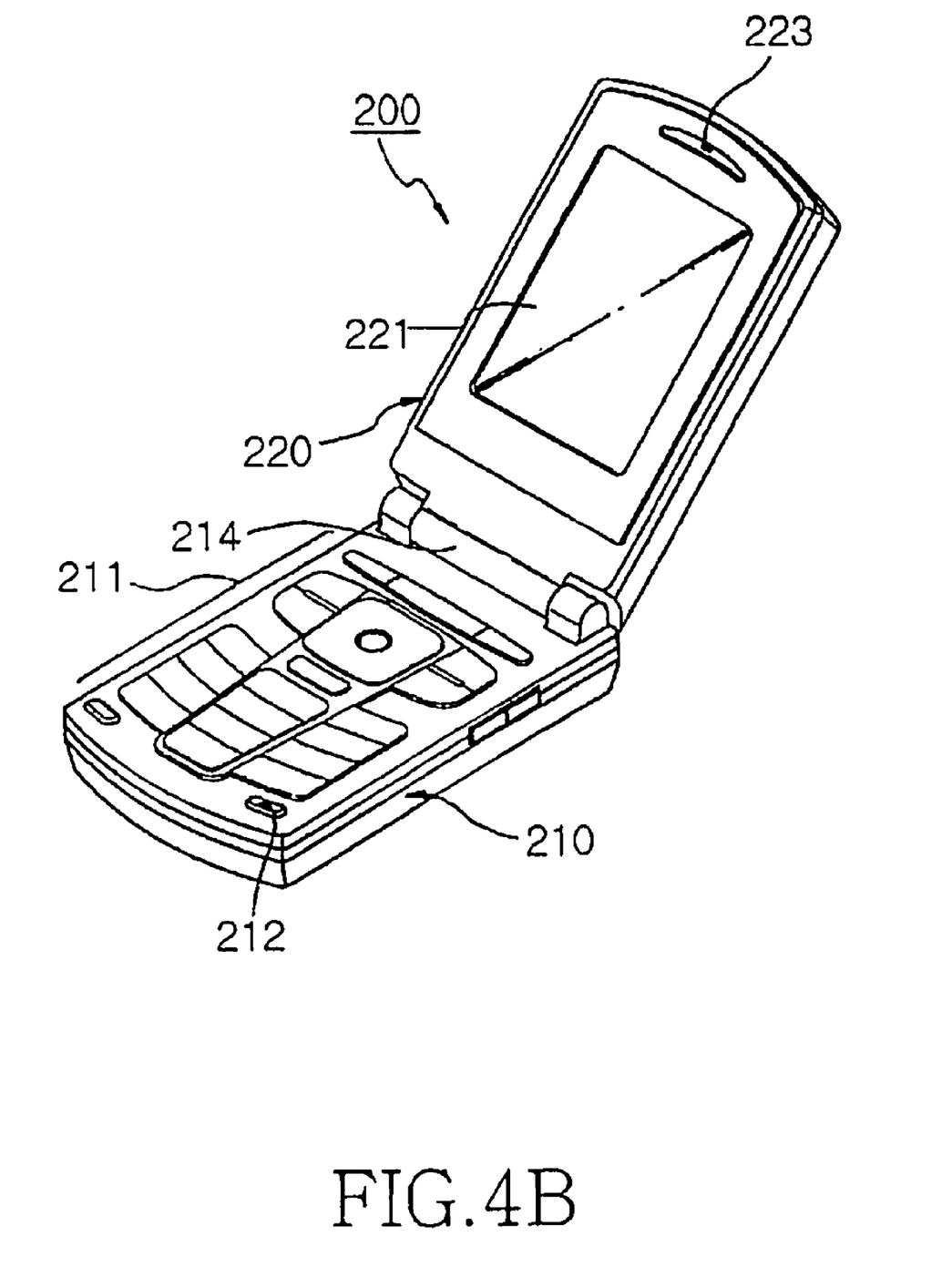

FIGS. 4A and 4B are perspective views illustrating opened and closed states of a folder type mobile terminal 200 employing an inseparable PCB module according to the present invention. Referring to the drawings, the folder type mobile terminal 200 includes a main body 210, and a folder 220 opened and closed with respect to the main body 210 at a predetermined angle by a hinge part 214. Although not shown, a hinge module is accommodated in the hinge part 214 to give a user certain feelings at the time of opening and closing the folder 220. Furthermore, the hinge module may be used as a pressurizing unit to open or close the folder within a predetermined angular range.

A keypad assembly 211 including a plurality of key buttons is formed on the main body 210. A microphone unit 212 is installed below the keypad assembly 211.

A main display unit 221 is installed on a surface of the folder 220 facing the keypad assembly 211. A speaker unit 223 is installed above the main display unit 221. As shown in FIG. 4A, a sub display unit 224 is installed on the other surface of the folder 220, and another keypad assembly 222 is installed under the sub display unit 224. The keypad assembly 222 may include function keys such as a navigation key button to use the terminal 200 even when the folder 22 is not opened with respect to the main body 210. Also, a camera module 225 for capturing a subject is installed above the sub display unit 224.

The folder 220 includes an electrical connection unit that electrically connects the folder to the main body 210 even though the folder 220 is continuously opened and closed with respect to the main body 210. In the present invention, preferably, the electrical connection unit is formed integrally with a PCB module 20 constituting the folder 220, thereby eliminating needs for a separate unit such as a connection cable. Hereinafter, the inseparable PCB module 20 used in the folder 220 according to the present invention will be described.

Figure 5:
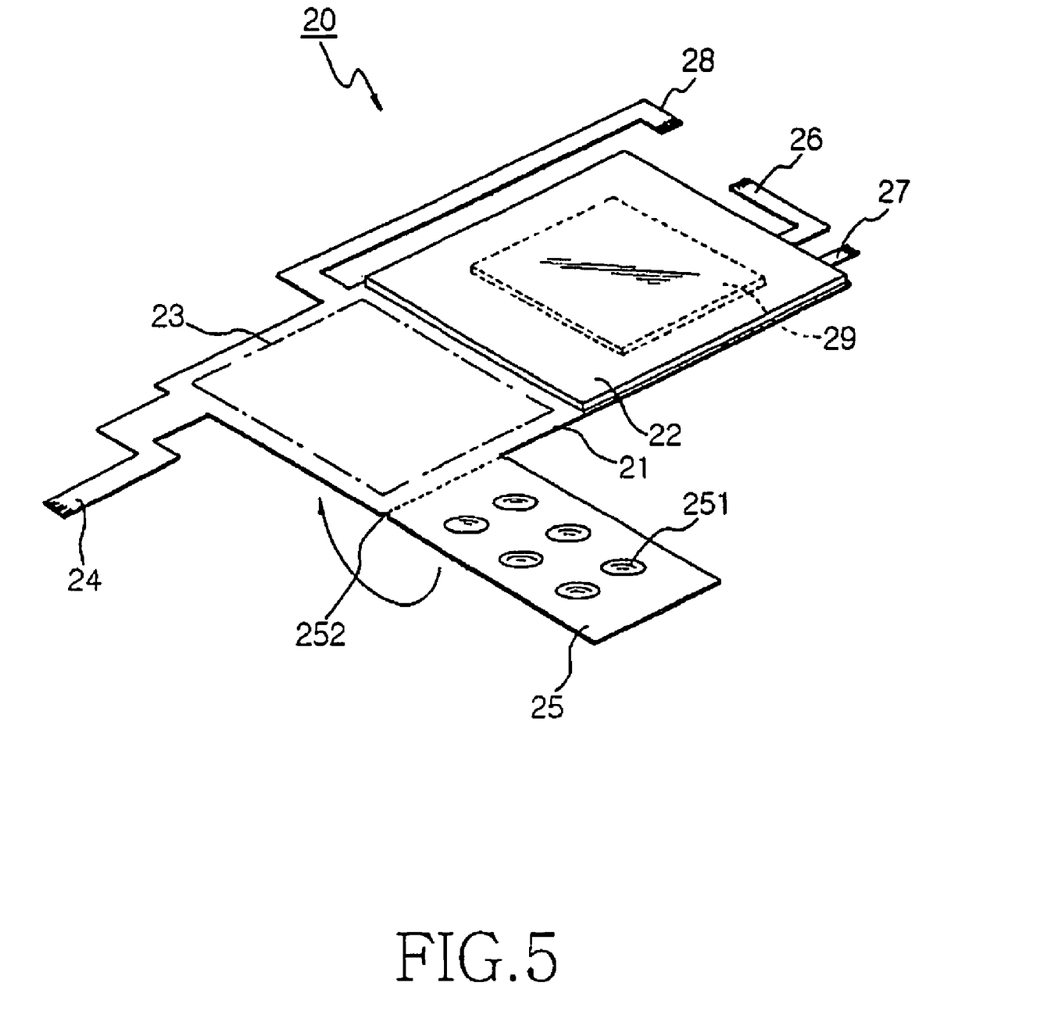
FIG. 5 is a perspective view of an inseparable PCB module according to the present invention.

FIG. 5 is a perspective view of an inseparable printed circuit board module (PCB module) 20 according to the present invention. In FIG. 5, all components of the folder 220 are electrically connected to one PCB module 20. Therefore, the PCB module 20 is preferably implemented as a flexible printed circuit board (FPCB).

As shown in FIG. 5, the PCB module 20 includes a body part 21 having almost the same area as that of the folder 220, and a main body connecting part 24, a keypad part 25, and a plurality of diverging parts 26, 27 and 28 that extend integrally from the body part 21. Also, predetermined patterns are formed at the extending parts, and thus electrical connections with desired components (e.g., a speaker unit, a camera module, a vibration unit, etc) can be made by those patterns.

A main LCD panel 22 having a predetermined size is mounted on a front surface of the body part 21. Also, a sub LCD panel 29 is mounted on a rear surface of the body part 21. The main LCD panel 22 is used as the main display unit 221 of the folder 220, and the sub LCD panel 29 is used as the sub display unit 224 of the folder 220. An electronic function group for operating the folder 220 is mounted in a region 23 of the body part 21 remaining after the mounting of the main LCD panel 22.

The main body connecting part 24 extending out from the body part 21 to a predetermined length in a predetermined direction penetrates a case frame of the folder, is led into the main body 210 via the hinge part 214, and then is electrically connected to the main board. The main body connecting part 24 has an extra portion long enough to prevent an open circuit or twist even though the folder 220 is frequently opened and closed.

The keypad part 25 is formed and extends at a side surface of the body part 21 where the electronic components are mounted. However the present invention is not limited thereto, and the keypad part 25 may be directly configured on the rear surface of the body part 21 if there is room. The keypad part 25 is used as the keypad assembly 222 of the folder 220. A plurality of metal domes 251 are attached to a front surface of the keypad part 25 at regular intervals, and are electrically connected to carbon contacts thereunder, respectively, so that key actions can be performed. The reason why the metal domes 251 are attached to the front surface of the keypad part 25 is that the keypad part 25 is folded toward the body part 21 in a predetermined direction (in the direction of the arrow in FIG. 5). Also, recesses 252 are formed at both ends of a folded boundary portion between the body part 21 and the keypad part 25, thereby facilitating the folding operation.

The diverging parts 26, 27 and 28 are used as an electrical connection unit for operating components of the folder 220. For example, the diverging parts 26, 27 and 28 may be electrically connected to a speaker unit, a vibration unit (not shown), and a camera module installed at the folder 220. Also, eventually, the diverging parts 26, 27 and 28 and the keypad part 25 are electrically connected to the main body connecting part 24 through the body part 21 by a predetermined pattern. Thus, various components of the folder 220 can be operated by key manipulation of the keypad assembly 211 configured on the main body 210.

According to the present invention, in a PCB module, components of one body are integrally formed with an electrical connection unit for a connection with the other body, thereby contributing to reduction of an entire volume and thickness of a device. Also, because a separate connection cable is not used, simple assembly is facilitated.

While the present invention has been shown and described with reference to certain preferred embodiments thereof, it will be understood by those skilled in the art that various changes in form and details may be made therein without departing from the spirit and scope of the present invention as defined by the appended claims.

What is claimed is:

1. A printed circuit board (PCB) module installed in a sub body of a device including a main body, the sub body configured to perform opening and closing operations with respect to the main body, comprising:
    a body part being disposed in the sub body, electrically connected to components of the sub body, and having a predetermined area on a top surface of the body part;
    a keypad part being extended at a first side of the body part, being mounted to the sub body, and having a front surface, the keypad part being folded toward the body part and overlapping the predetermined area with the front surface facing the top surface; and
    a main body connecting part extending from the body part for a predetermined length and electrically connected with the main body.

2. The PCB module of claim 1, wherein the body part comprises an LCD panel mounted over a predetermined region, and an electronic function group and a plurality of metal domes mounted in a remaining region, the metal domes being used as a data input unit.

3. The PCB module of claim 1, wherein the body part comprises at a predetermined portion, a plurality of diverging parts extending therefrom to a predetermined length, the diverging parts being electrically connected to components of the sub body.

4. The PCB module of claim 1, wherein the PCB module is one of an ultra-thin rigid PCB and an FPCB (flexible printed circuit board).

5. The PCB module of claim 3, wherein the diverging parts are electrically connected to a speaker unit, a vibration unit, and a camera module.

6. The PCB module of claim 3, wherein one of the diverging parts is a keypad comprising a data input unit including a plurality of metal domes.

7. The PCB module of claim 6, wherein the keypad is mounted to a rear surface of the keypad part, the rear surface opposite the front surface.

8. The PCB module of claim 7, wherein a plurality of electronic components are mounted to the predetermined area.

9. The PCB module of claim 8, wherein a shield can is interposed between the top surface and the front surface, the shield can protecting the electronic components, supporting the rear surface, and shielding electromagnetic waves between the top surface and the front surface.

10. A portable terminal comprising:
a main body;
a sub body configured to perform opening and closing operations with respect to the main body; and
a printed circuit board (PCB) module installed in the sub body, the PCB module including a body part having having a predetermined area on a top surface of the body part, and a keypad part being extended at a first side of the body part and having a front surface, the keypad part being folded toward the body part and overlapping the predetermined area with the front surface facing the top surface.

11. The portable terminal of claim 10, wherein the body part comprises an LCD panel mounted over a predetermined region, and an electronic function group and a plurality of metal domes mounted in a remaining region, the metal domes being used as a data input unit.

12. The portable terminal of claim 10, wherein the body part comprises at a predetermined portion, a plurality of diverging parts extending therefrom to a predetermined length, the diverging parts being electrically connected to components of the sub body.

13. The portable terminal of claim 10, wherein the PCB module is one of an ultra-thin rigid PCB and an FPCB (flexible printed circuit board).

14. The portable terminal of claim 12, wherein the diverging parts are electrically connected to a speaker unit, a vibration unit, and a camera module.

15. The portable terminal of claim 12, wherein one of the diverging parts is a keypad comprising a data input unit including a plurality of metal domes.

16. The portable terminal of claim 15, wherein the keypad is mounted to a rear surface of the keypad part, the rear surface opposite the front surface.

17. The portable terminal of claim 16, wherein a plurality of electronic components are mounted to the predetermined area.

18. The portable terminal of claim 17, wherein a shield can is interposed between the top surface and the front surface, the shield can protecting the electronic components, supporting the rear surface, and shielding electromagnetic waves between the too surface and the front surface.

* * * * *